United States Patent [19]
Boon et al.

[11] Patent Number: 6,071,067
[45] Date of Patent: Jun. 6, 2000

[54] TUBE PUSHER PLATE INCLUDING ROTARY DISK AND CYLINDRICAL GUIDE ROD

[75] Inventors: Thomas Wong Han Boon; Wu Tian Sing; Ronnie Lee Hock Boon, all of Singapore, Singapore

[73] Assignee: Advanced Micro Devices, Inc., Sunnyvale, Calif.

[21] Appl. No.: 09/285,413

[22] Filed: Apr. 2, 1999

[51] Int. Cl.[7] .................................................. B65B 69/00
[52] U.S. Cl. ................................. 414/797.8; 414/797.9; 414/417
[58] Field of Search ........................... 414/797.8, 797.7, 414/797.9, 417; 221/93, 95; 312/42, 45

[56] References Cited

U.S. PATENT DOCUMENTS

| | | | |
|---|---|---|---|
| 3,602,378 | 8/1971 | Thompson | 414/797.9 |
| 4,500,246 | 2/1985 | Janisiewicz et al. | 414/403 |
| 4,539,740 | 9/1985 | Scrantom et al. | 29/564.1 |
| 4,588,342 | 5/1986 | Hirokawa et al. | 414/125 |
| 4,862,578 | 9/1989 | Holcomb | 414/417 |
| 4,941,795 | 7/1990 | Elliot et al. | 414/403 |
| 5,035,322 | 7/1991 | Faes et al. | 206/328 |
| 5,246,328 | 9/1993 | Schuppert, Jr. et al. | 414/417 |
| 5,370,495 | 12/1994 | Montalvo et al. | 414/797.9 |
| 5,470,196 | 11/1995 | Park | 414/797.9 |
| 5,733,093 | 3/1998 | Palm et al. | 414/417 |

FOREIGN PATENT DOCUMENTS

| | | | |
|---|---|---|---|
| 62-185634 | 9/1987 | Japan | 414/797.9 |
| 2220649 | 1/1990 | United Kingdom | 414/797.9 |

*Primary Examiner*—Douglas Hess
*Attorney, Agent, or Firm*—Skjerven Morrill Macpherson Franklin & Friel LLP; Paul E. Lewkowicz

[57] ABSTRACT

An apparatus for unloading tubes containing IC devices is disclosed, providing a quiet, low-wear device for separating and ejecting empty tubes from the bottom of a stack. The apparatus consists of a conventional input tube unloading system with novel tube pusher plate, rotary disk, and guide rod elements that reduce wear on both the apparatus and the tubes themselves. The potential risk of damage to the devices in the tubes is also reduced. The apparatus operates quietly because of low friction contact points with the tubes, thus reducing operator fatigue associated with noise.

4 Claims, 11 Drawing Sheets

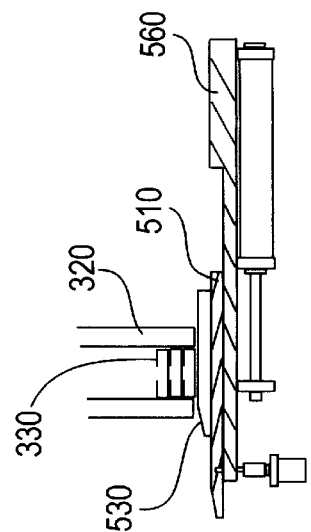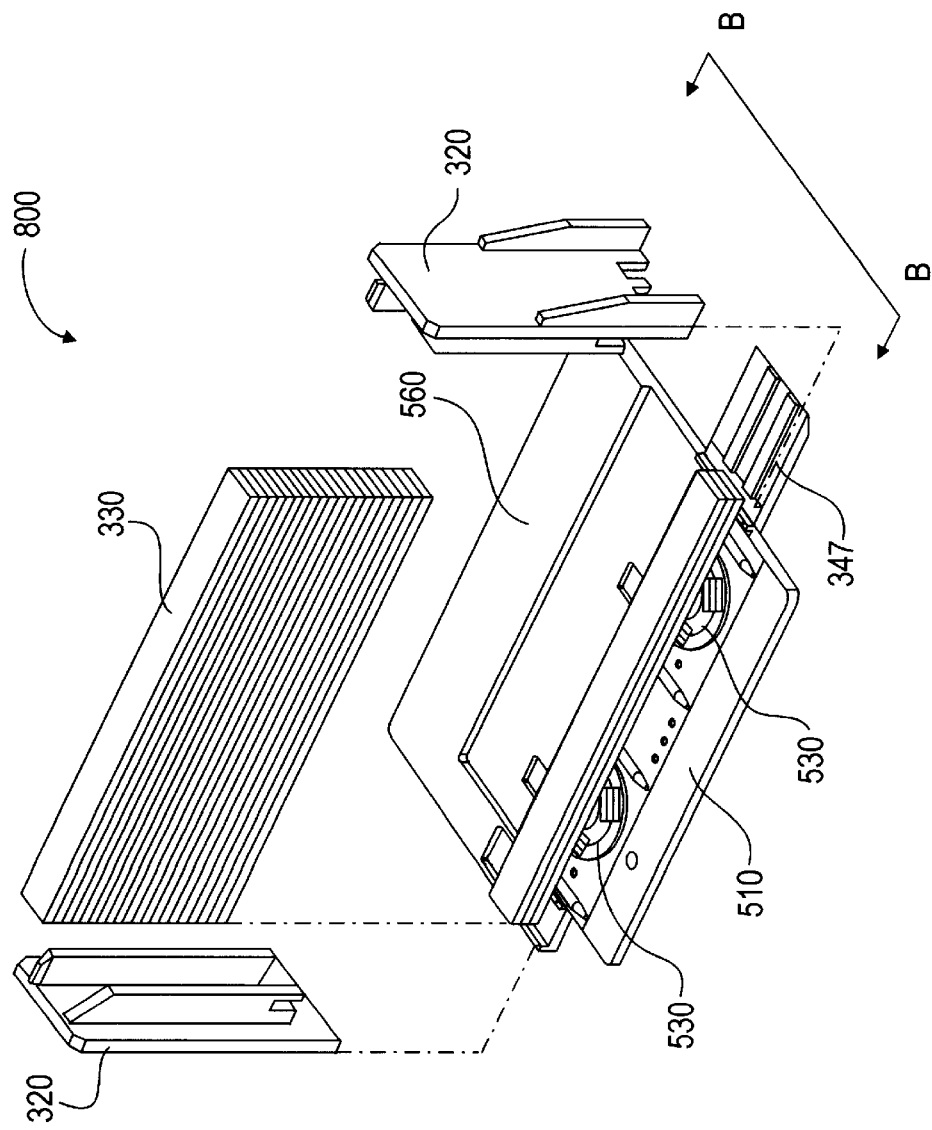

TUBE PUSHER PLATE INCLUDING ROTARY DISK AND CYLINDRICAL GUIDE ROD

BACKGROUND OF THE INVENTION

1. Field of the Invention

The present invention relates to automated manufacturing equipment, more particularly to systems for handling electronic devices.

2. Description of the Related Art

Automated systems for electronic component assembly and test often utilize mechanical handling devices to speed processing and eliminate or reduce the potential for damage to the components. One such type of handling device is the input tube unloader 100 of FIG. 1. A tube unloader is a machine that receives plastic or metal tubes containing, for example, integrated circuits (ICs) encased in plastic leadless chip carriers (PLCCs). The contents of the tubes are generally referred to as "devices." The input tube unloader 100 is used in the beginning of a production process to rapidly and safely remove the devices from the tubes and feed them into the next machine on the production line. In this manner, devices can be automatically supplied to inspection, test, or circuit board assembly systems, to name but a few, with a minimum potential for damage in handling. FIG. 2 shows one use of the input tube unloader in a system 210 that performs visual inspection of devices. Input tube unloader 100 provides a flow of devices for inspection station 220. Devices are reloaded into tubes at output tube loader 230. The entire process is performed on a single handler support structure 240.

Input tube unloader 100 typically consists of a moving plate 310 (also sometimes referred to as a pusher plate) and a pair of side guide plates 320 to hold tube stack 330 vertically, as shown in FIG. 3. Moving plate 310 acts as a separator and guide for the tubes. Moving plate 310 moves freely atop base plate 340 using two sets of guide rods (or linear slides), bushings, bush housings and mounting blocks (not shown). The extension and retraction of moving plate 310 is controlled from below by conventional actuator means, such as a pneumatic cylinder (not shown).

The initial position of moving plate 310 is extended, so that tube stack 330 rests on top of it. At the start of operation, moving plate 310 is retracted, allowing the bottom-most tube in the stack to drop onto the unloading area of base plate 340. In a typical use, gravity is allowed to pull the devices out of the tube, through an opening 345 in guide plate 320, and onto a feedtrack 347 for conveyance to the next part of the line.

After all of the devices are released from the bottom-most tube, the moving plate is extended as shown by arrow 350 in FIG. 3 to separate the empty tube from tube stack 330. The extension of moving plate 310 also ejects the empty tube from the handler into a bin or other collection system 360 to be recycled or reused. Moving plate 310 then moves back to its retracted position, allowing tube stack 330 to drop a new bottom-most tube into position on base plate 340 for unloading. The process repeats until the machine is stopped by the operator or all tubes are emptied and ejected.

FIG. 4 shows a simplified cross-section of unloader 100. A problem with prior art tube unloaders is the rubbing between the second-to-last tube 402 and the top surface of moving plate 310, depicted in region 410 of FIG. 4, when extending to eject bottom-most tube 401. Over time, the tubes tend to wear down from this contact, losing dimensional accuracy and becoming prone to jamming. The operation is also noisy, leading to increased operator fatigue.

Additionally, because of the contact between bottom-most tube 401 and moving plate 330, the top surface of moving plate 330 can lose its coating and/or dimensional accuracy over time. This leads to jams at region 420 and the need to replace the degraded components of unloader 100.

A further drawback arises from the difference in the friction characteristics and overall design of metal tubes versus plastic tubes. Because moving plate 310 is thicker than a metal tube, tubes occasionally get stuck midway through the separation and ejection process. This type of jamming also has the potential for damaging devices in second-to-last tube 402, which is highly undesirable.

What is needed is a quiet means for separating and ejecting empty tubes that avoids damage to the tubes and the devices therein. Furthermore, an apparatus that reduces wear on both the tubes and the unloader parts is needed to reduce costs and extend equipment lifetime.

SUMMARY

An apparatus for unloading tubes containing IC devices is disclosed, providing a quiet, low-wear means for separating and ejecting empty tubes from the bottom of a stack. The apparatus consists of a conventional input tube unloading system with novel tube pusher plate, rotary disk, and guide rod elements that reduce wear on both the apparatus and the tubes themselves. The potential risk of damage to the devices in the tubes is also reduced. The apparatus operates quietly because of low friction contact points with the tubes, thus reducing operator fatigue associated with noise.

BRIEF DESCRIPTION OF THE DRAWINGS

The present disclosure may be better understood, and its numerous objects, features, and advantages made apparent to those skilled in the art by referencing the accompanying drawings.

FIG. 8A is an exploded isometric view of the extended position of the moving plate.

FIG. 8B is a simplified side-view of the extended position of the moving plate.

The use of the same reference symbols in different drawings indicates similar or identical items.

DETAILED DESCRIPTION

Figure 5:
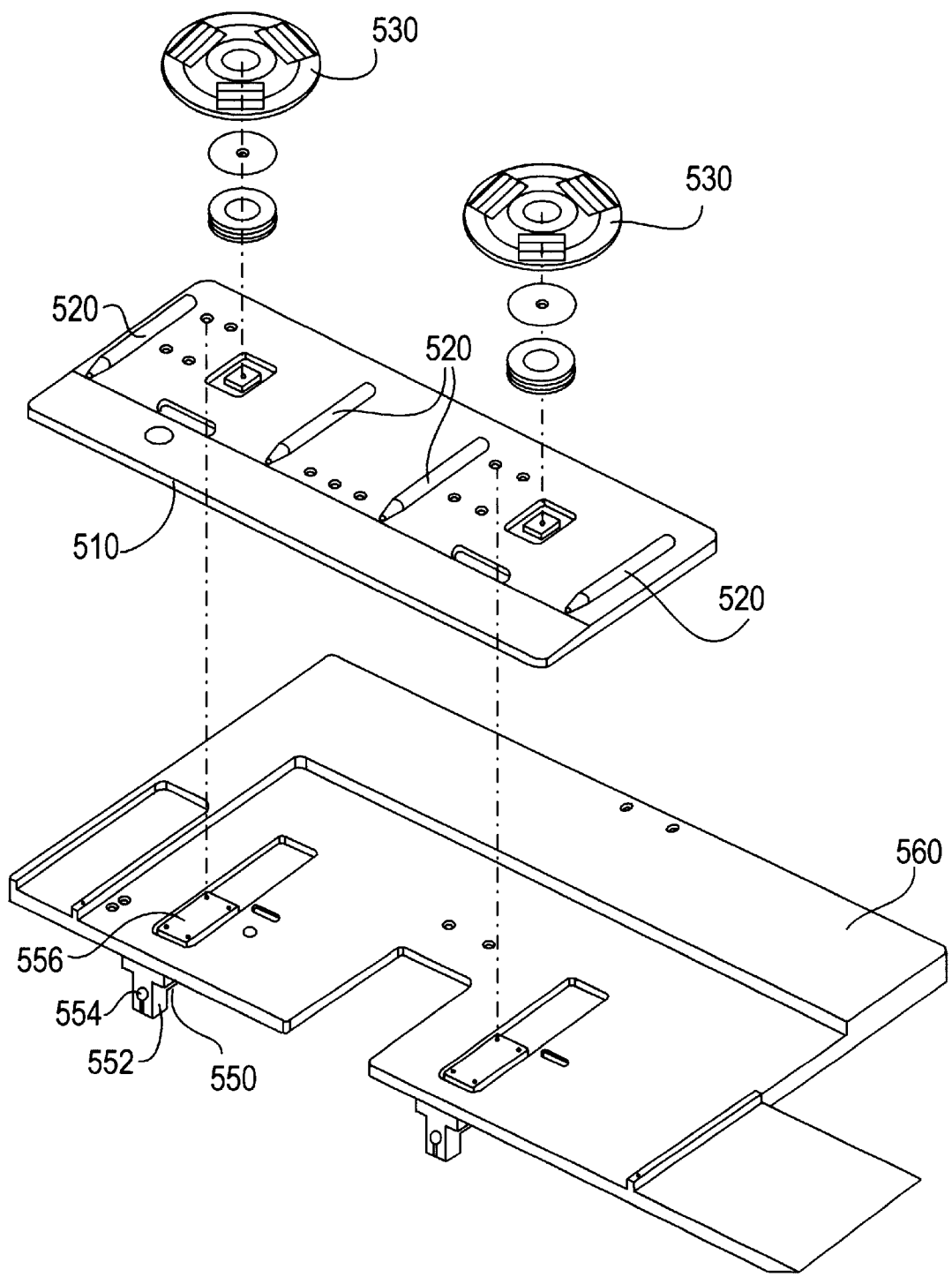
FIG. 5 is an exploded isometric view of one embodiment of the present invention.

FIG. 5 shows an exploded view of one embodiment of the present invention with guide plates 320 removed for clarity. Moving plate 510 (also known as a "pusher plate" in the art) has two types of components mounted on its top surface: rotary disks 530 and cylindrical guide rods 520. In one embodiment of the present invention, two rotary disks 530 and four guide rods 520 are used. Different quantities of each component can be used, depending on the length of the tubes handled and the required moving plate length. For very long tubes, more than two rotary disks 530 may be required.

Figure 1:
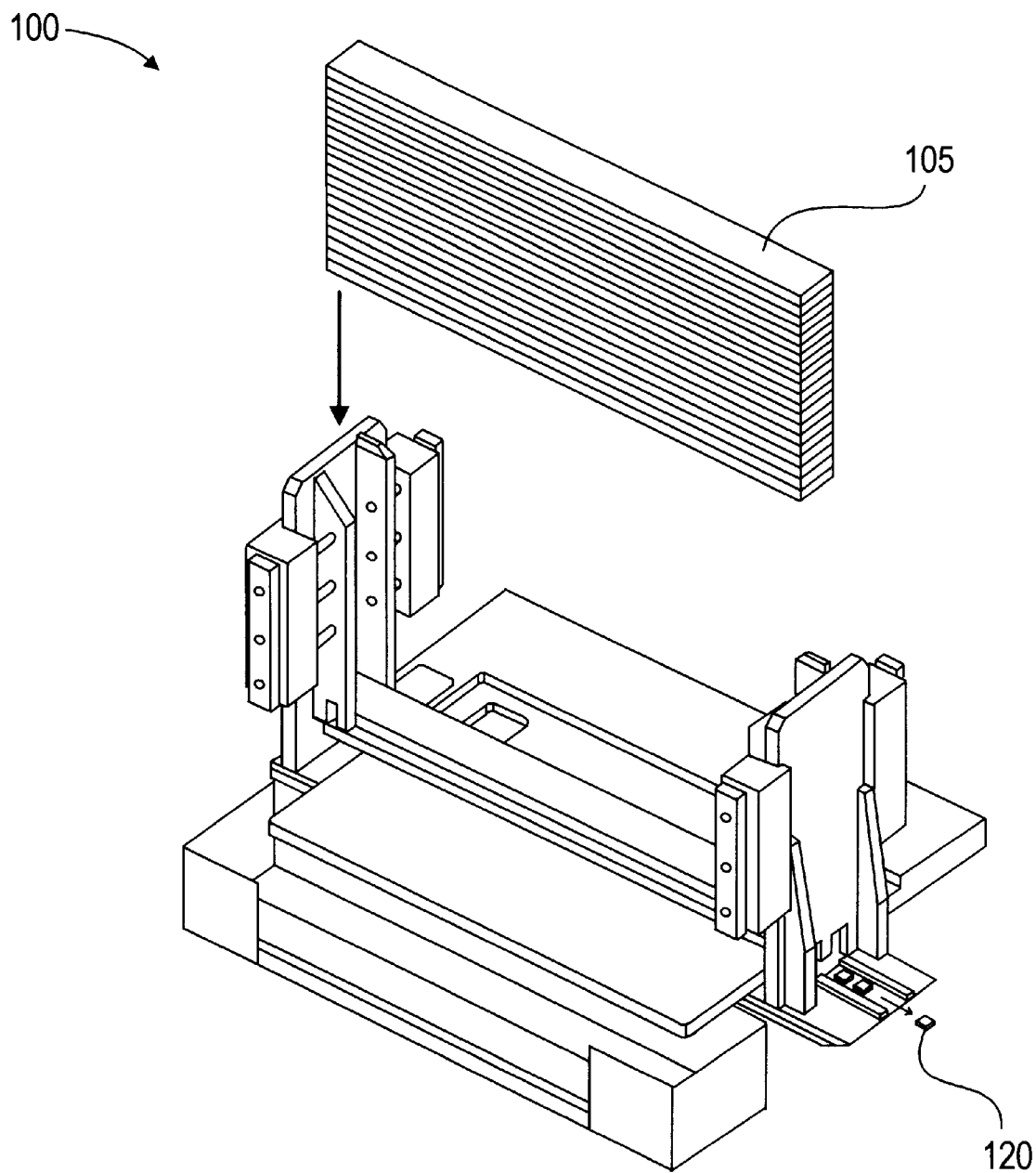
FIG. 1 is an isometric view of a prior art input tube unloader.
Figure 2:
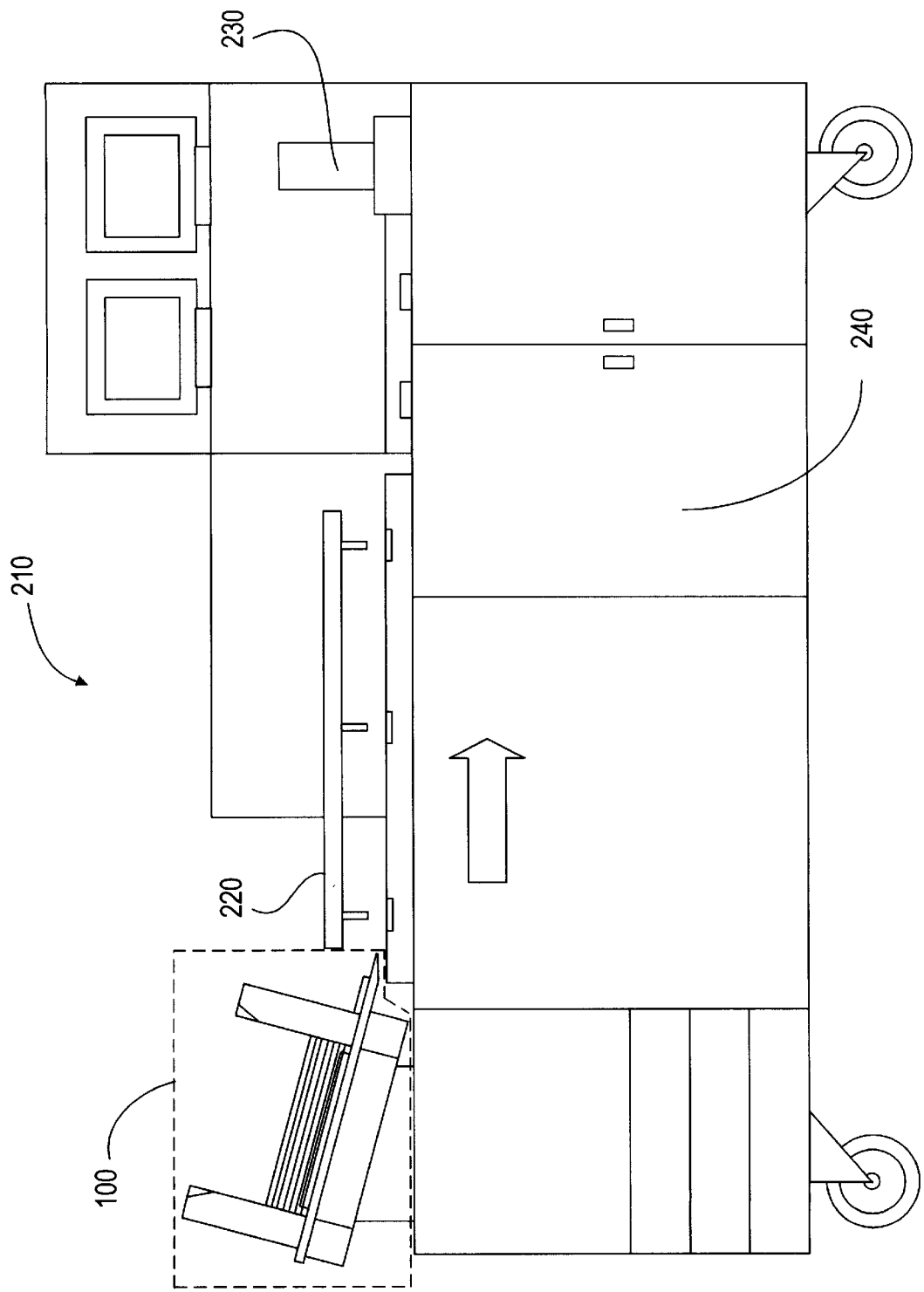
FIG. 2 is a front view of a prior art input tube unloader in use in an inspection system.
Figure 3:
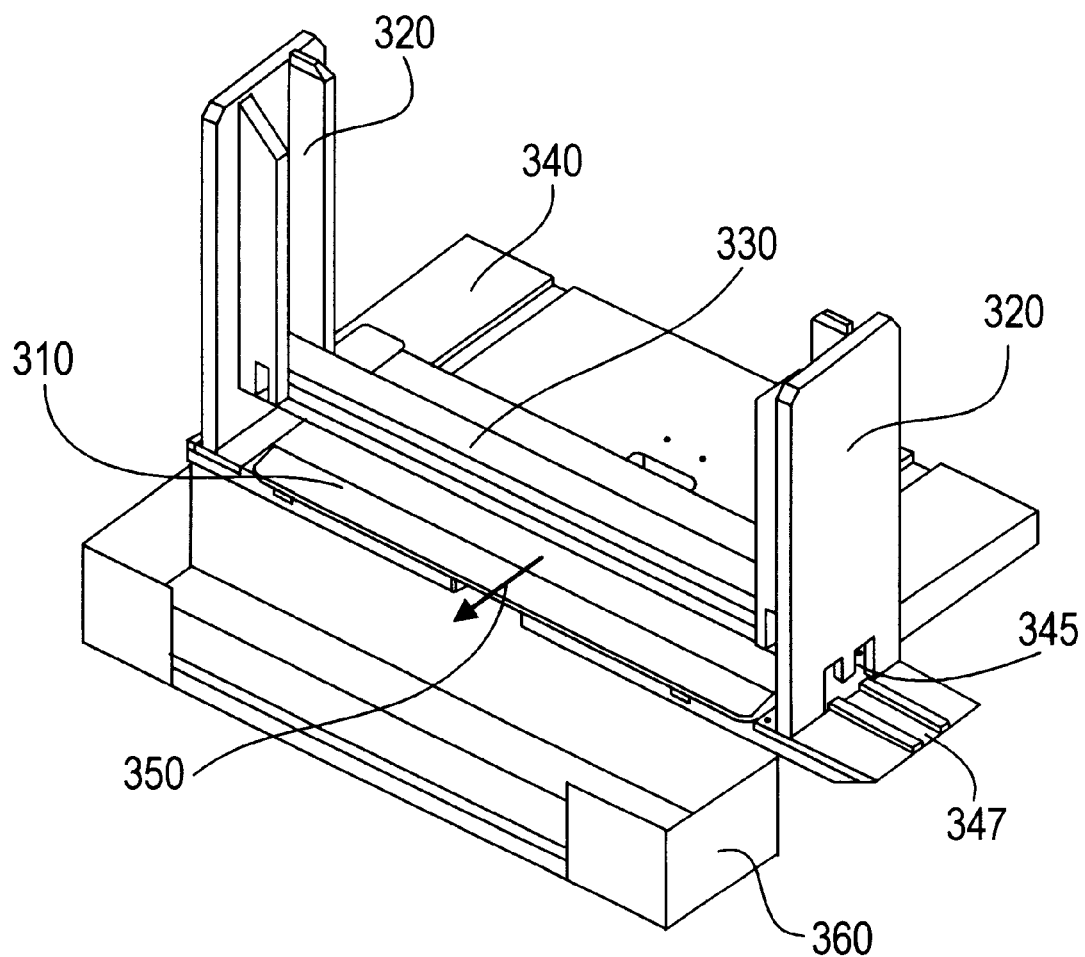
FIG. 3 is an isometric view of the prior art input tube unloader.
Figure 4:
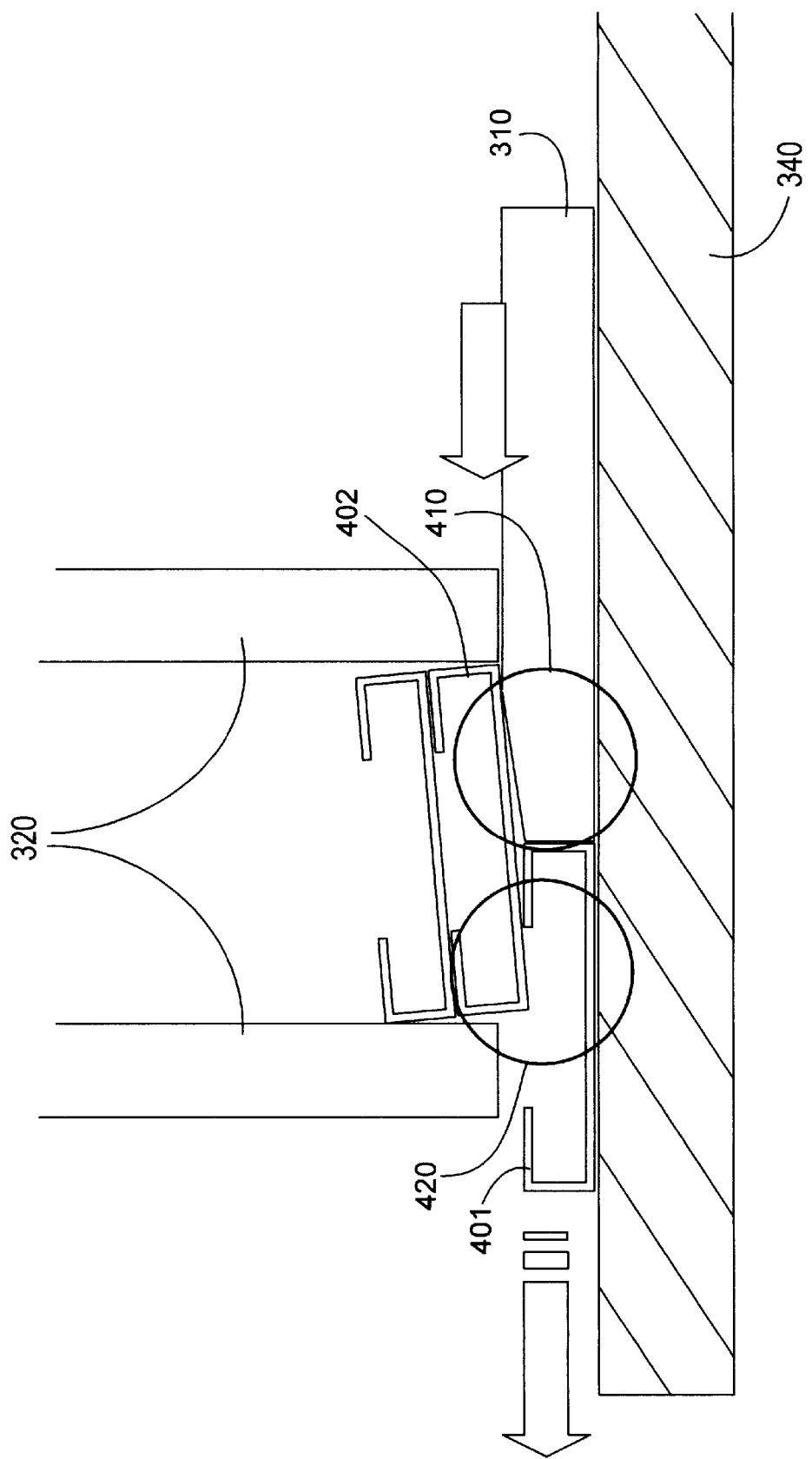
FIG. 4 is a simplified side view of a prior art input tube unloader showing its drawbacks.
Figure 6:
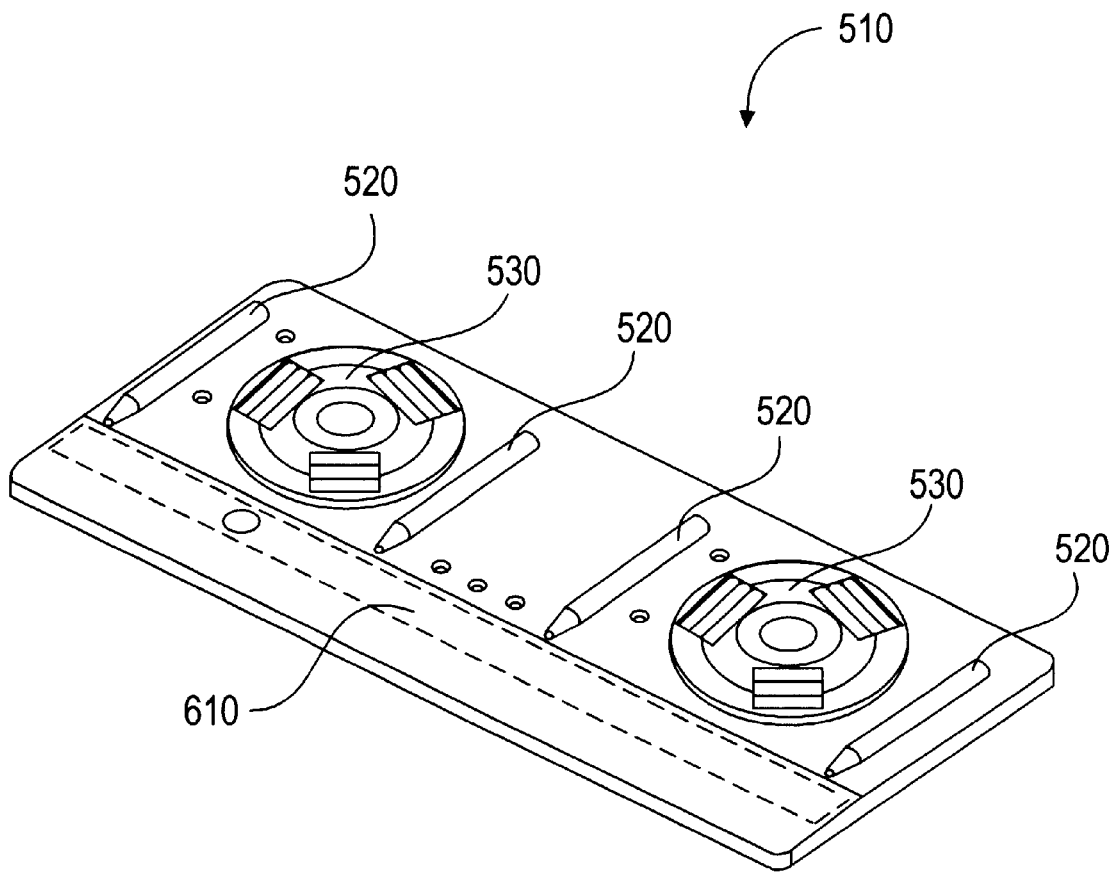
FIG. 6 is an isometric view of one embodiment of the present invention.

FIG. 6 shows moving plate 510 with rotary disks 530 and guide rods 520 mounted. As in the prior art (FIG. 3), tubes 330 are stacked vertically between guide plates 320 (not shown).

Moving plate

Referring to FIG. 5, moving plate 510 is mounted on a conventional base plate 560 with conventional means for laterally translating moving plate 510. In one embodiment, lateral motion perpendicular to the long dimension of moving plate 510 is provided by a pneumatic cylinder (not shown) mounted beneath base plate 560 and connected to moving plate 510. Moving plate 510 is mounted on mounting blocks 556, which slide on rods 550. Rods 550 are held in place by bushing 554 and bush housing 552.

Although a pneumatic cylinder is described for supporting and imparting motion to moving plate 510, other means, such as those including linear motors, are well known in the art. Accordingly, the present invention is not limited to any particular means of supporting or translating moving plate 510.

While unloading, the tubes rest in unloading area 610 (FIG. 6), a substantially flat portion of moving plate 510.

Rotary Disks

Figure 7A:
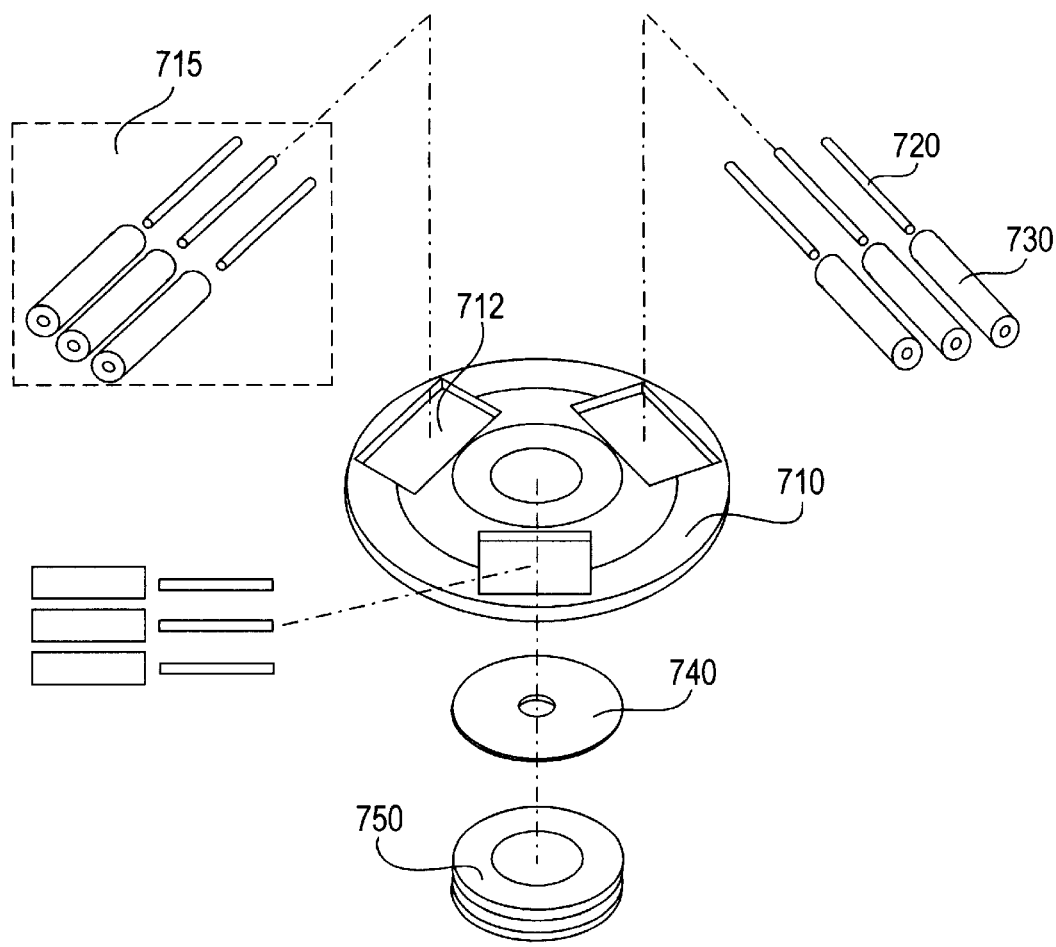
FIG. 7A is an exploded isometric view of the rotary disk.

In one embodiment of the present invention, shown in exploded form in FIG. 7A, rotary disks 530 consist of a substantially flat, rigid disk 710 containing three apertures 712. Into each aperture 712 a set of three roller bearings 715 are fitted. Each roller bearing consists of axle 720 and roller 730. Rigid disk 710 is supported from below by washer 740 and thrust bearing set 750.

Figure 7B:
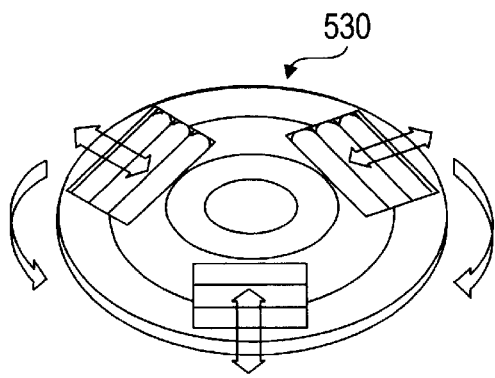
FIG. 7B is an isometric view of the rotary disk depicting the rotational degrees of freedom.

Each roller bearing set 715 is arranged radially, with axles 720 located tangential to the circumference of disk 710. The three sets of roller bearings are spaced equidistantly around the circumference of disk 710. Roller bearings 715 enable any object (e.g., a tube) placed on top of them to easily slide off in any direction. Thrust bearing set 740 allows disk 710 to rotate freely around its central axis. FIG. 7B shows the rotation of rotary disk 530 as a whole and the rotation of roller bearings 715 in particular.

Although roller and thrust bearings are described, those skilled in the will art realize that bearings of other types can be used. Accordingly, the invention is not limited to any particular type of bearings.

Guide Rods

In one embodiment, guide rods 520 (FIG. 6) are rigid cylinders composed of a hard material such as metal. Rigidity and abrasion resistance are necessary characteristics so that guide rods 520 can separate and eject tubes 330. Accordingly, cross-sectional shapes other than cylindrical and materials other than metal are encompassed within the scope of this disclosure.

Guide rods 520, in one embodiment, are chamfered on the inboard end, i.e., on that end closest to and in contact with the side of the bottom-most tube during tube unloading. (See the Sequence of Operation discussion and FIGS. 8E and 8G below). Chamfering is preferred in order to allow the bottom-most tube in the stack to be easily separated from the second-to-last tube during moving plate 510 extension. Chamfering (or any similar taper or smoothing of the inboard end of guide rod 520) also eliminates any jarring or knocking against the device-filled second-to-last tube while ejecting the empty bottom-most tube.

Sequence of Operation

A sequence of operation of the tube unloader of the present invention is shown in FIGS. 8A through 8J. Conventional elements used in the prior art and described above and in FIGS. 3 and 5 bear the same reference symbols. Elements of the present invention described above and in FIG. 5 are likewise similarly labeled.

When unloader 800 is at rest, moving plate 510 is in its extended position, shown in an exploded isometric view in FIG. 8A. A side view from line B-B is given in FIG. 8B. Stack of tubes 330 is loaded by an operator. Instead of resting directly on the moving plate as in the prior art, tubes 330 sit atop rotary disks 530.

Figure 8D:
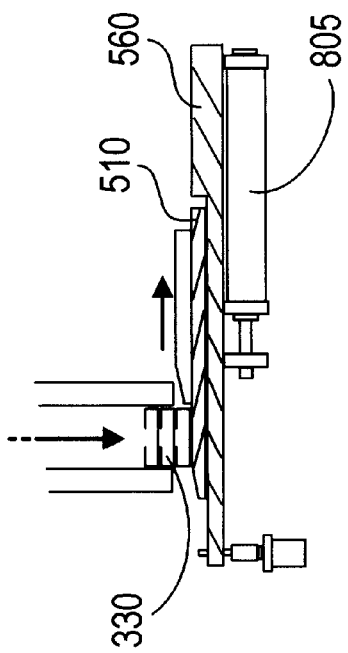
FIG. 8D is a simplified side-view of the retracted position of the moving plate.
Figure 8E:
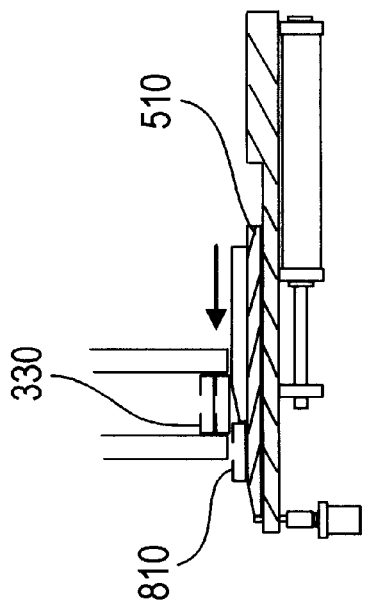
FIG. 8E is a simplified side-view of the partly extended position of the moving plate.
Figure 8C:
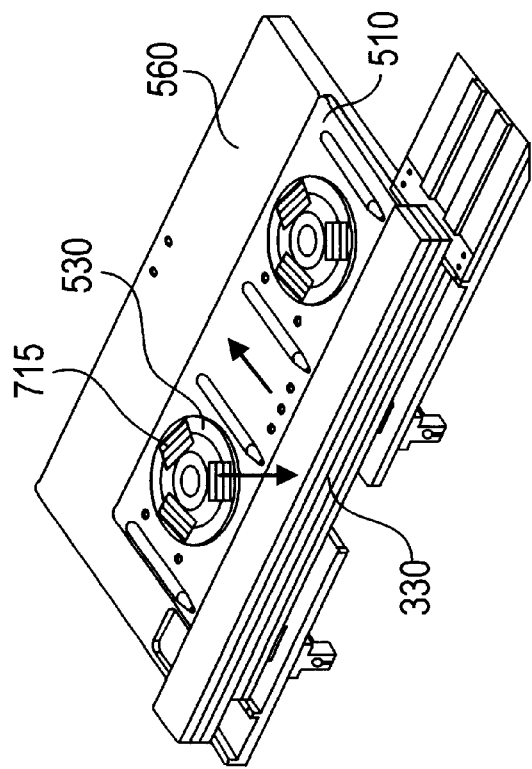
FIG. 8C is an isometric view of the retracted position of the moving plate.

In FIG. 8C, moving plate 510 is then moved to its retracted position by pneumatic piston 810 (FIG. 8D), allowing the bottom-most tube in stack of tubes 330 to roll off rotary disks 530 and drop onto the unloading area 610 of moving plate 510. Frictional forces exerted by tubes 330 on moving plate 510 are greatly reduced by roller bearings 715 in rotary disks 530. This reduction in friction almost entirely eliminates wear and tear on moving plate 510.

Figure 8G:
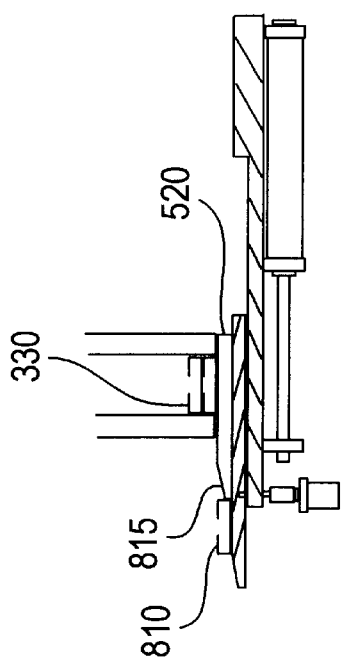
FIG. 8G is a simplified side-view of the fully extended position of the moving plate, showing the ejected tube.

After all of the devices from the bottom-most tube in stack of tubes 330 are emptied, moving plate 510 extends to separate the empty bottom-most tube 810 from stack of tubes 330, FIG. 8E. Separation is accomplished by guide rods 520, which contact the inboard edge of bottom-most tube 810, shown in FIG. 8F. A side view of guide rod 520 in contact with bottom-most tube 810 is depicted in FIG. 8G. The chamfer 815 on the in-board edge of guide rod 520 is employed to smoothly separate bottom-most tube 810 from the second-to-last tube in stack of tubes 330.

Figure 8H:
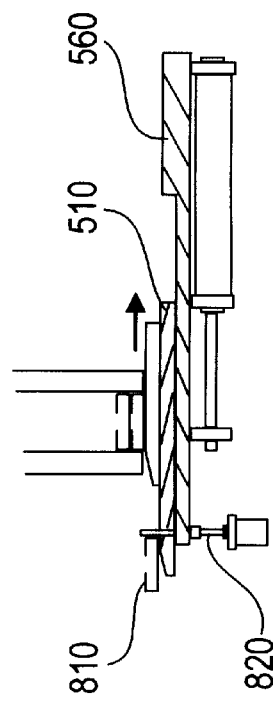
FIG. 8H is a simplified side-view of the partly retracted position of the moving plate.
Figure 8F:
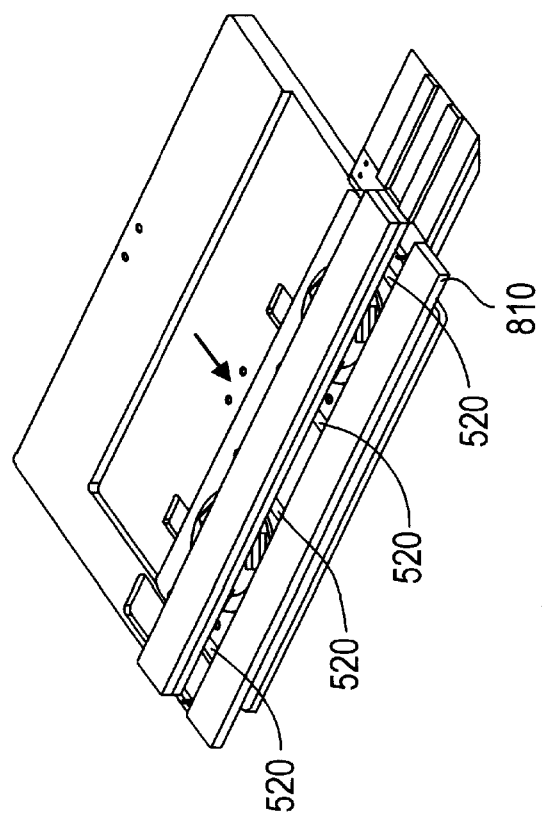
FIG. 8F is an isometric view of the extended position of the moving plate indexing a new tube and ejecting the empty tube.
Figure 8J:
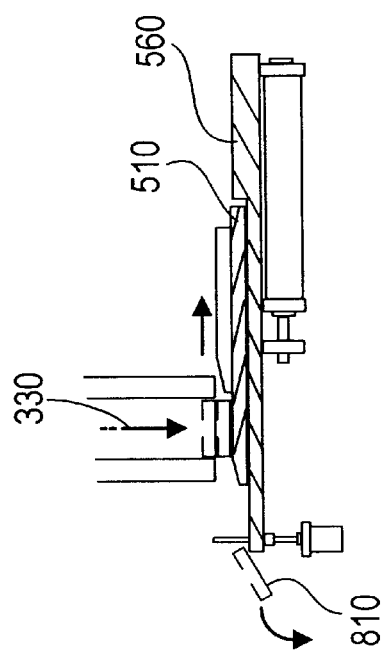
FIG. 8J is a simplified side-view of the fully retracted position of the moving plate.
Figure 8I:
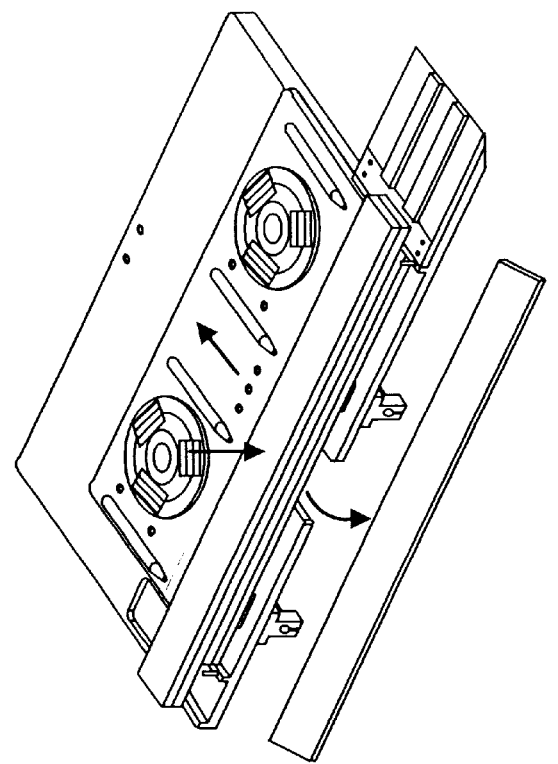
FIG. 8I is an isometric view of the retracted position of the moving plate.

As moving plate 510, is retracted from the fully extended position, FIG. 8H, solenoid plunger 820 extends to prevent empty tube 810 from sticking to moving plate 510 or guide rods 520. Empty tube 810 then falls into a container (not shown) for later reuse or recycling, FIG. 8I. As moving plate 510 continues to retract, FIG. 8J, stack of tubes 330 rolls across rotary disk 530 and lands on the unloading area 610 of moving plate 510, beginning the unloading cycle anew.

We claim:

1. An apparatus for handling a stack of substantially tubular containers comprising:

a moving plate having a top surface, said moving plate capable of motion between a retracted position and an extended position;

a plurality of guide rods disposed on the top surface of said moving plate substantially parallel to the motion of said moving plate such that said guide rods contact an inboard side of a bottom-most tubular container when said moving plate is in the retracted position; and a plurality of rotary disks disposed on the top surface of said moving plate each comprising:

a substantially planar disk adapted to revolve around a central axis perpendicular to the surface of said planar disk having a plurality of apertures disposed around said central axis;

a plurality of first bearings located within each said aperture; and a second bearing concentric with the central axis and disposed between said planar disk and the top surface of said moving plate.

2. An apparatus as recited in claim 1 wherein the inboard top edge of said guide rods are chamfered.

3. An apparatus as recited in claim 1 wherein the first bearings are captive bearings held within the apertures.

4. An apparatus as recited in claim 3 wherein the first bearings are roller bearings that rotate around a longitudinal axis tangential to the central axis of said rotary disks.

* * * * *